United States Patent [19]

Podtburg

[11] Patent Number: 5,914,297

[45] Date of Patent: Jun. 22, 1999

[54] PRECURSOR COMPOSITES FOR OXYGEN DISPERSION HARDENED SILVER SHEATHED SUPERCONDUCTOR COMPOSITES

[75] Inventor: Eric R. Podtburg, Natick, Mass.

[73] Assignee: American Superconductor Corp, Westborough, Mass.

[21] Appl. No.: 08/626,130

[22] Filed: Apr. 5, 1996

[51] Int. Cl.$^6$ .................................................. H01L 39/24
[52] U.S. Cl. ........................ 505/510; 505/230; 505/236; 505/238; 505/701; 505/704; 428/615; 428/701; 428/702; 428/930
[58] Field of Search ..................... 505/230, 231, 505/236, 238, 510, 701, 704; 174/125.1; 428/373, 375, 389, 688, 689, 699, 701, 702, 930, 615

[56] References Cited

U.S. PATENT DOCUMENTS

| | | | |
|---|---|---|---|
| 4,826,808 | 5/1989 | Yurek et al. ................................ | 505/1 |
| 4,962,084 | 10/1990 | de Barbadillo, II et al. . | |
| 5,017,553 | 5/1991 | Whitlow et al. ............................ | 505/1 |
| 5,034,373 | 7/1991 | Smith et al. ................................. | 505/1 |
| 5,063,200 | 11/1991 | Okada et al. ............................... | 505/1 |
| 5,296,456 | 3/1994 | Shiga et al. ................................ | 505/1 |
| 5,384,307 | 1/1995 | Lay ........................................ | 505/430 |
| 5,550,103 | 8/1996 | Motowidlo et al. ..................... | 505/430 |

OTHER PUBLICATIONS

B. Ullman et al., "Phase Formation and Critical Currents in Bi (2223) Tapes", *Advances in Superconductivity VII*, Proceedings of the 7th International Symposium on Superconductivity (ISS '94), Nov. 8–11, 1994, pp. 753–756.

*Primary Examiner*—Marie Yamnitzky
*Attorney, Agent, or Firm*—Choate, Hall & Stewart

[57] ABSTRACT

An oxide superconductor composite having improved texture and durability. The oxide superconductor composite includes an oxide superconductor phase substantially surrounded with/by a noble metal matrix, the noble metal matrix comprising a metal oxide in an amount effective to form metal oxide domains that increase hardness of the composite. The composite is characterized by a degree of texture at least 10% greater than a comparable oxide superconductor composite lacking metal oxide domains. An oxide superconducting composite may be prepared by oxidizing the precursor composite under conditions effective to form solute metal oxide domains within the silver matrix and to form a precursor oxide in the precursor alloy phase; subjecting the oxidized composite to a softening anneal under conditions effective to relieve stress within the noble metal phase; and converting the oxide precursor into an oxide superconductor.

5 Claims, 1 Drawing Sheet

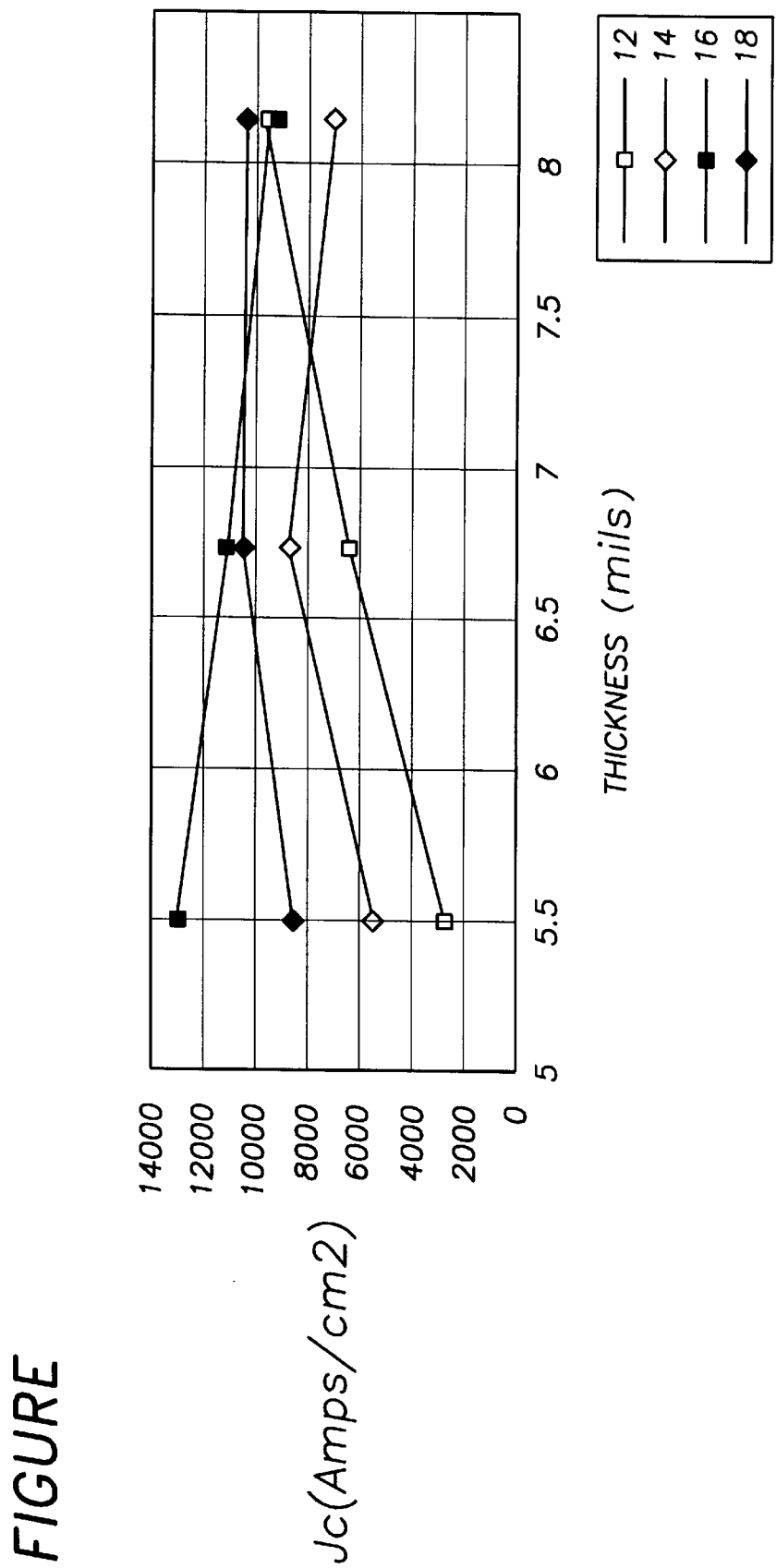

PRECURSOR COMPOSITES FOR OXYGEN DISPERSION HARDENED SILVER SHEATHED SUPERCONDUCTOR COMPOSITES

The U.S. Department of Energy may have certain rights to this invention under government contract No. DE-FG02-93ER81605.

FIELD OF THE INVENTION

This invention relates to oxide superconductor articles having a noble metal cladding or sheath with improved durability, and mechanical and electrical properties. The invention further relates to oxide dispersion silver (ODS) hardened oxide superconductor composites.

BACKGROUND OF THE INVENTION

The discovery of high temperature oxide superconductors enabled the operation of superconducting devices at liquid nitrogen temperatures, about 77K, instead of liquid helium temperatures, about 4.2K. Among the many applications for this new class of materials are power transmission lines, electric motors and superconducting magnets. Many of these applications will require the development of durable, flexible wires or tapes of the oxide superconductor.

Due to the brittleness of the oxide superconductor, oxide superconducting articles typically are formed as composites of the oxide superconductor and a ductile, inert (or noble) metal, such as silver. Silver imparts desirable mechanical properties, such as reduced brittleness, to the otherwise brittle oxide ceramic. Further, the silver matrix provides a good means of thermal dissipation and may function as an electrical shunt in the event of an electrical short. While the ductile metal provides flexibility to the composite, it is soft and prone to distortion under use conditions. An increase in strength or mechanical toughness of an oxide superconducting composite while retaining the flexibility of a silver-oxide composite is desirable.

Oxide dispersion hardening is a phenomena which imparts increased strength to a matrix material by precipitating metal oxide domains from the matrix material. Oxide dispersion hardening exists when small oxide particles (typically less than about 500 microns) are dispersed throughout the metal matrix. The hardness of the oxide domains impart strength and toughness to the matrix. These oxide particles, however, disadvantageously form sites where dislocations may be pinned in concentric Orowan Loops surrounding the oxide particle. Such pinned dislocations may be the source of material failure in the matrix metal.

Oxide dispersion hardening has been used in the field of oxide superconductivity to improve the hardness and mechanical strength of the silver-oxide superconductor composite. However, conventionally prepared oxide dispersed silver (ODS) hardened alloys often crack or fracture during conventional wire-making operations, such as rolling, drawing or pressing. This cracking may be due to reduced ductility in the precipitation hardened composite, presumably due to the formation of pinning sites during precipitation of the metal oxide domains in the silver matrix.

In a typical oxide powder in tube method (OPIT), an oxide superconductor powder is introduced into an ODS sheath. Multiple wire forming operations are performed in order to obtain a wire or tape having the dimensions, density and texture required of the oxide superconductor composite. See, for example, Sandhage et al. JOM, 21 (March, 1991). These processing operations are hindered by the brittle nature of the ODS sheath and often result in undesirable cracking of the composite. In order to avoid cracking, additional processing steps involving smaller deformation stresses are used. This adds to processing time and costs.

Alternatively, U.S. Pat. No. 5,384,307 to Lay describes preparation of a superconducting article in which an oxide superconductor core and a silver alloy sheath (including a solute metal) are reacted in an oxidizing atmosphere consisting of three to fourteen volume percent oxygen. The solute metal of the silver alloy sheath is converted to a metal oxide under these reaction conditions. In addition to the drawbacks previously mentioned which are associated with increased sheath brittleness, ODS hardening processes such as disclosed by Lay may degrade the oxide superconductor's electrical properties. In particular, the process may alter the oxygen stoichiometry of the oxide superconductor because the solute metal, typically magnesium or aluminum, is so reactive that it will react with the core oxide superconductor such that the oxide superconductor is reduced at the expense of the solute metal of the silver alloy. Thus, the oxygen of the oxide superconductor may be depleted and oxygen stoichiometry is altered.

The ODS hardening reactions of the prior art have deleterious effects on the composition, process ability and electrical performance of the oxide superconductor article. There remains a need for an oxide superconductor composite with increased strength and hardness without the limitations of the prior art.

It is an object of the invention to provide an oxide superconductor article of improved durability and ductility having a sheath with oxide particles disposed therein.

It is an object of the invention to provide an oxide superconductor composite having improved handling capability due to increased hardness and reduced brittleness.

It is yet another object of the invention to prepare an ODS hardened oxide superconductor composite without deleterious effect to the mechanical and electrical properties of the oxide superconductor.

It is a further object of the present invention to obtain an oxide superconductor composite which possesses improved electrical performance, such as critical current density.

It is yet another objective to obtain ODS BSCCO tapes with improved texture.

SUMMARY OF THE INVENTION

In one aspect of the invention, an oxide superconductor composite is provided in which an oxide superconductor phase is substantially surrounded by a noble metal matrix. The silver matrix comprises a metal oxide in an amount effective to form metal oxide domains that increase hardness of the composite. The composite is characterized by a critical current density at least 10% greater than a comparable oxide superconductor composite lacking metal oxide domains.

In another aspect of the invention, an oxide superconductor composite is provided in which an oxide superconductor phase is substantially surrounded with a noble metal phase, the noble metal phase comprising a metal oxide in an amount effective to form metal oxide domains that increase hardness of the composite, the composite characterized by a degree of texture at least 10% greater than a comparable oxide superconductor composite lacking metal oxide domains. The composite has a hardness of greater than 60 KHN and preferably in the range of 60 KHN to 200 KHN.

The invention also provides an oxide superconductor precursor alloy in which a precursor alloy phase is comprised of component metallic elements of an oxide superconductor in substantially stoichiometric proportions and a noble metal phase alloyed with a solute metal in intimate contact with the precursor alloy, the solute metal present in an amount effective to form metal oxide domains that increase hardness of the composite. The precursor alloy may contain up to a 30 wt % excess amount of copper.

Another aspect of the invention includes a method for making a precipitate hardened oxide superconductor of superior electrical properties and improved hardness by oxidizing a composite comprising a precursor alloy phase comprising component metallic elements of an oxide superconductor in substantially stoichiometric proportions and a noble metal matrix alloyed with a solute metal in intimate contact with the precursor alloy; under conditions effective to form solute metal oxide domains within the noble metal matrix and to form a precursor oxide in the precursor alloy phase.

In another embodiment of the present invention, the oxidized precursor composite is subjected to a softening anneal under conditions effective to relieve stress within the noble metal matrix. The time and temperature of softening anneal preferably is insufficient to produce coarsening of the solute metal oxide domains. In preferred embodiments, the solute metal is selected from the group consisting of Mg, Zr, Hf, Ti, Al, alkaline earths, lanthanides and mixtures thereof and in other preferred embodiments, the solute metal is present in an amount sufficient to produce about 0.01 to about 2.0 vol % oxide in the silver matrix after oxidation.

By "softening anneal", as that term is used herein, it is meant exposing an ODS hardened body to a temperature and for a time sufficient to reduce the hardness of the alloy and insufficient to cause the oxide domains to coalesce. Both time and temperature will affect the softening anneal.

The noble metal matrix is inert or "noble" to oxidation and/or other chemical reactions under the processing conditions used in the formation of the oxide superconductor composite. The noble metal includes metals such as silver, gold and platinum and mixtures thereof.

BRIEF DESCRIPTION OF THE DRAWING

The invention may be understood with reference to the Figure which is a plot of critical current density ($J_c$) v. tape thickness for a series of comparison silver clad tapes and MgO/Ag clad tapes.

DETAILED DESCRIPTION OF THE INVENTION

The present invention is directed to preparing an ODS-hardened noble metal/oxide superconductor composite which overcomes the limitations of prior art methods and composites and which possesses many advantages over prior art composites. Practice of the invention may prevent undesirable mechanical degradation of the composite, such as reduced ductility, while imparting increased strength and improved electrical properties to the composite. The invention is described with reference to silver as the noble metal, however, it is contemplated that other noble metals may be used.

According to the invention, a precursor composite is provided having a metallic precursor alloy phase and a silver alloy matrix. The silver matrix is alloyed with a metal solute. The metallic precursor alloy includes the component metallic elements of an oxide superconductor in substantially stoichiometric proportions. The precursor composite is oxidized to oxide dispersion harden the silver matrix by forming solute metal oxide domains (or particles) within the silver matrix and to oxidize the metallic precursor alloy into a precursor oxide. These oxide particles harden the silver matrix and improve its handleabiltiy. It is believed that the hardening is accomplished by the oxide particles pinning dislocations by forming Orowan loops. As the precursor oxide composite is worked, a softening anneal is needed to anneal out defects and dislocations in the ODS-hardened silver matrix.

The precursor composite is oxidized under conditions effective to form metal oxide domains (from oxidation of the metal solute) within the noble metal phase. Reaction conditions which form oxide domains in the silver matrix additionally are effective to oxidize the metallic precursor alloy to form an oxide precursor to an oxide superconductor (hereinafter, a "precursor oxide"). The precursor oxide may be simple, binary or ternary oxides of the component metals of the oxide superconductor. Because the metallic precursor alloy is oxidized to a precursor oxide in the same processing step as the oxidation of solute metals to form precipitated oxide domains in the silver matrix, there is no tendency for the solute metal to "rob" oxygen from the oxide superconductor phase. Thus, degradation of oxide superconducting properties due to scavenging of oxygen by the solute metal from the oxide superconductor is avoided.

The use of metallic precursors for both the oxide superconductor and the ODS hardened sheath allows the composite to be formed into desired shapes, such as tapes, wires, sheets, etc., while it is still in a malleable state. This is an advantage over the prior art methods of introducing an oxide superconductor powder into an ODS sheath, because deformation processing is not carried out on the more brittle ODS hardened composite. It also represents an advantage over prior art methods which introduce an oxide superconductor powder into an unoxidized silver alloy sheath, on which deformations may be performed but which may deplete the oxide superconducting core of oxygen.

The solute metal is capable of being oxidized in an internal oxidation process. One or more solute metals may be used. The solute metal is desirably miscible in the silver matrix, benign to the oxide superconductor and capable of imparting desirable mechanical properties, such as high strength or toughness, to the silver matrix. Suitable solute metal include, but are in no way limited to, aluminum, magnesium, yttrium, hafnium, zirconium, titanium, alkaline earths, lanthanides and mixtures thereof. Although selection of the solute metal may be empirical, it may be desirable to select a solute metal with a large heat of formation constant ($\Delta G$) such that the oxide particles will form throughout the silver matrix. It may also be desirable, for the reasons discussed hereinbelow, to select a solute metal having a low mobility in silver.

The solute metal is present in an amount sufficient to provide, upon oxidation, about 0.01 vol % to about 2.0 vol % solute metal oxide in silver. The amount of solute metal may be adjusted to raise or lower the ductility of the ODS sheath depending upon processing requirements. For example, 0.21 wt % magnesium in silver produces 1 vol % MgO in silver after oxidation. If 0.05 wt % Mg is used, the ductility of the ODS sheath will increase, and the mechanical properties of the sheath will decrease slightly.

Generally, temperatures in the range of about 200° C. to about 500° C. in an oxidizing atmosphere will be sufficient to obtain the desired result. Oxidation is conducted until the precursor composite is substantially completely oxidized. Oxidation time is a function of the rate of mass transport of oxygen into the composite. Lower oxidation temperatures significantly decrease mass transport and increase reaction times. If shorter reaction times are desired, correspondingly higher oxidation temperatures may be used. Larger or thicker geometries require longer reaction times (or higher temperatures) as well.

High oxidation temperatures and/or long reaction times have the undesirable effect of promoting migration and diffusion of metallic elements throughout the composite. Thus, the metallic precursor elements may diffuse into the surrounding noble metal phase and/or the solute metal and noble metal may migrate into the metallic precursor alloy phase. Selection of alloyed elements having low mobility in the matrix metal, as suggested above for the metal solutes, is desirable but may not always be a viable option.

In order to minimize diffusion, the precursor composite may be oxidized under conditions of high oxygen activity. For the purposes of this application, high oxygen activity is considered to be oxygen activity equivalent to the activity of pure oxygen in its gaseous form ($O_2$) at a temperature of greater than 200° C. and at a pressure greater than ambient. Under conditions of high oxygen activity, oxygen diffuses readily into the composite, while diffusion of the metallic precursor elements into the silver is significantly restricted. In a preferred embodiment, the precursor composite is oxidized at high oxygen pressure (about 15 psi to about 3000 psi oxygen) at a temperature in the range of about 200° C. to 450° and preferably in the range of about 320° to 430° C. Total pressure may be in the range of about 15–30,000 psi, with the diluting gas being a non-reactive gas, such as Ar, $N_2$, He, Ne, Kr or Xe. The high pressure oxidation process is set forth in detail in U.S. Pat. No. 5,472,527 to Otto et al. and is herein incorporated in its entirety by reference.

Once the ODS hardened precursor oxide composite has been formed, it is typically further processed to convert the precursor oxide into the desired oxide superconductor phase, to introduce texture into the composite for improved electrical current carrying capability and to further refine the article geometry. For example, in order to obtain an oxide superconducting wire with the appropriate thickness and texture, it is advantageous to apply about 50–95% total deformation strain to the oxidized precursor. During deformation, dislocations pile up providing loci for material failure, such as cracking and fracturing. Additionally, as discussed hereinabove, the oxide dispersion hardening process may have introduced pinning sites which limit the deformability of the oxide composite.

The inventors have discovered that such post-oxidation processing of the precipitate hardened precursor composite is improved considerably upon being subjected to at least one softening anneal. The softening anneal of the present invention is carried out at a temperature and for a time sufficient to reduce the brittleness of the alloy and insufficient to cause the oxide domains to coalesce significantly. The softening anneal conditions will vary dependent upon the solute metal used. The processing history of the composite will also have an effect on the softening anneal condition, since different processing steps will introduce different defects and stresses into the composite to a greater or larger extent. The softening anneal may be performed at any time after oxidation of the precursor composite, however, it is preferably performed before significant deformation processing of the composite occurs.

The energy needed to anneal out such dislocations may be significant. For copper, Orowan Loops are generally only dissipated at an annealing temperature of greater than 95% the melting point of the metal matrix. Similar temperature scales have been used when annealing a silver matrix. For example, studies have demonstrated that anneal temperatures above 810° C. reduce the hardness of MgO. Anneal temperatures for softening $Al_2O_3$-Ag composites may be considerably lower. Temperatures above 700° C. should be sufficient to soften the $Al_2O_3$-Ag composite.

In addition to conditions which will soften the ODS silver matrix, the anneal conditions are selected with consideration of the following factors: (1) the reaction conditions should not promote coarsening of the precipitate oxide domains; and (2) the reaction conditions should be selected so that undesirable phase changes within the oxide phase do not occur and desirable reactions do occur.

Elevated anneal temperatures for extended time will cause the oxide domains to coalesce, which may have deleterious effects on the composite properties. Thus, anneal time is desirably limited to prevent oxide domain coarsening and is preferably in the range of 1 minute to 3 hours, and more preferably in the range of 5 to 30 minutes. The anneal will also be acting on the oxide precursor and thus, it will be appreciated that short anneal times will convert only small amounts of precursor oxide to oxide superconductor.

The softening anneal may be carried out in addition to or in conjunction with any other heat treatment used in the processing of the oxide superconductor composite. Suitable anneal conditions will be constrained by the oxide superconductor system selected and the phase transformation to be carried out on the oxide phase. It is desirable that the anneal conditions not form undesirable phases in the oxide precursor, for example oxide phases which are not readily converted into the oxide superconductor. It is preferred that the oxide precursor be converted into a desirable oxide phase during the softening anneal. For example, a softening anneal in the BSCCO system preferably converts the oxide precursor into BSCCO-2212. This may be accomplished by heat treatment (for MgO/Ag sheath) at a temperature in the range of 790° C. to 855° C., and preferably 810 to 855°, at an oxygen pressure of 0.01 to 1 atm. Alternatively, a softening anneal in the YBCO-124 system preferably converts the oxide precursor directly to the 124 oxide superconductor. This may be accomplished by heat treatment (for $Al_2O_3$/Ag sheath) at a temperature in the range of 700° C. to 825° C. at an oxygen pressure of about 1 atm. Selection of appropriate solute metal oxides may take into consideration the particular oxide superconducting system being used. For example, softening anneal conditions should be compatible with oxide superconducting processing conditions.

In a preferred embodiment, the softening anneal is conducted under conditions which are additionally effective to convert the precursor oxide into an oxide material having anisotropic or plate-like grain structures. Anisotropic oxides are well suited to deformation induced texturing (DIT). Deformation induced texturing uses deformation processes such as rolling and pressing to orient grains (an the c-axis) of the oxide material.

In some embodiments, the final oxide superconductor itself is the anisotropic oxide to be textured. For example, staged growth DIT has been used successfully to texture $YBa_2Cu_4O_x$. See, co-pending U.S. Ser. No. 07/881,675 filed May 12, 1992, which is herein incorporated by reference, for further details. In other embodiments, an intermediate oxide may be used as the anisotropic oxide to be textured, which is finally converted to the desired oxide superconductor with retention of texture. For example in the BSCCO system, (Bi,Pb)Sr$_2$Ca$_1$Cu$_2$O$_x$ (BSCCO-2212), where x is a value sufficient to provide superconductivity at greater than 77K, is typically used for texturing and it is then converted into (Bi,Pb)$_2$Sr$_2$Ca$_2$Cu$_3$O$_y$ (BSCCO-2223), where y is a value sufficient to provide superconductivity at greater than 77K, in a final stage of the process. The softening anneal may convert all or a portion of the precursor oxide into the anisotropic oxide. Alternatively, the anisotropic oxide may be formed after the softening anneal in a subsequent processing step.

In a preferred embodiment, a portion of the precursor oxide is annealed to relieve internal stresses and to convert the precursor oxide to an anisotropic oxide. About 1% to 70%, and preferably about 10% to 50% of the precursor oxide is converted to the anisotropic oxide in the softening anneal. The anisotropic oxide composite is subjected to a deformation process, such as rolling, drawing, extruding, pressing or any other conventional technique which shapes and/or textures the composite. The extent of deformation is limited to within the strain tolerances of the composite, which have been greatly improved over the conventional ODS hardened composites by the softening anneal of the invention. In a single deformation process between softening anneals (the deformation can be carried out in several steps), it has been demonstrated that texture strains of up to 60% can be tolerated by the system. Texture strains in the range of about 20–60% are recommended.

The composite may be then subjected to a further softening anneal, which relieves internal stresses introduced from the previous deformation processing and converts a subsequent portion of the precursor oxide into the anisotropic anneal. Iterations of softening anneal and deformation steps are continued until the composite no longer contains a substantial amount of precursor oxide and/or the composite has acquired the requisite texture and/or geometry.

The textured anisotropic oxide composite is then converted in a subsequent process into the oxide superconductor. (This step is unnecessary where the anisotropic oxide is the oxide superconductor.) Conditions which form oxide superconductors are well known for each of the many oxide superconductor systems and it is contemplated that any conventional process may be used in the method of the invention. In particular, the heat treatments described in WO 94/23459 published Oct. 13, 1994 are is particularly useful in processing the oxide phase into an oxide superconductor and is hereby incorporated in its entirety by reference.

Metallic precursors of any oxide superconductor may be used in the present invention. In particular the invention is suitable for use in the formation of yttrium barium copper oxide bases (YBCO), bismuth strontium calcium copper oxide bases (BSCCO) and thallium-based oxide superconductor composites. The component metallic elements are used in substantially stoichiometric proportions. It is recognized that the stoichiometric proportions are approximate and may be varied somewhat as is required by the particular oxide superconductor system. As used herein, "substantially stoichiometric" includes excesses of copper (of up to 30 wt %) in the metallic precursor. See, U.S. Ser. No. 102, 561 filed Aug. 5, 1993, which is herein incorporated by reference. In addition, metallic elements may be partially substituted (doped) by additional elements where the desirability for doing so is demonstrated. The principles of the formation of oxide superconductors from metallic precursor alloys is set forth in U.S. Pat. No. 4,826,808 to Yurek et al., which is incorporated herein by reference. Metallic precursor alloys may be prepared by any conventional alloying technique, including but not limited, to melt alloying and mechanical alloying. See, U.S. Pat. No. 5,034,373 to Smith et al., which is incorporated by reference.

The method may be used with any oxide superconducting/noble metal composite. The oxide superconductor composite may be processed in any shape, such as, by way of example only, wires, tapes, sheets, cables, rings or coils. The composite may be a monofilament wire or tape in which the oxide superconductor is encased in a noble metal sheath. Alternatively, the composite may be a wire or tape made up of a plurality of oxide superconductor filaments, all of which are embedded within a noble metal matrix, or which are separately embedded in a plurality of matrices and then twisted or braided together in a cabled form. The oxide superconductor phase may additionally include a noble metal.

The oxide superconductor composites prepared according to the method of the invention described herein possess superior electrical properties because there has been no depletion of oxygen or alteration of the oxygen stoichiometry during processing. The oxide superconductor composites are substantially crack-free due to processing using the softening anneal. Further, the composite hardness is significantly improved over silver-only composites. For example, silver composites have a hardness in the range of about 25–30 KHN, whereas the ODS composites have hardnesses greater than 60 KHN, and in particular in the range of 60 KHN to 200 KHN.

An advantage of the present invention is the improved texture observed in ODS hardened tapes of the invention. Improvements in degree of texturing of about 10% and as great as 15.5% have been observed as compared to comparably processed silver-only sheathed tapes. This improvement in texturing of the anisotropic oxide is reflected in improved critical current densities in the final oxide superconductor composite. See, the FIGURE.

With reference to the FIGURE, curves 12 and 14 represent the critical current density as a function of sample thickness for BSCCO-2223 oxide superconductor composites having a silver only composite sheath. The sample of curve 12 was processed using 2 softening anneal/deformation cycles and the sample of curve 14 was processed using 4 softening anneal/deformation cycles. Curves 16 and 18 represent the critical current density as a function of sample thickness for BSCCO-2223 oxide superconductor composites having an MgO-silver sheath. Curves 16 and 18 were processed with two and four anneal/deformation cycles, respectively. At all thicknesses and processing conditions, the samples of curves 16 and 18 demonstrated superior critical current density. The mechanism for the improvement in texture is not completely understood, it is hypothesized that the tougher precipitate hardened silver sheath can better and more evenly transfer the texturing deformation forces throughout the composite.

The invention may be understood with reference to the following examples which are intended as illustrative only and which are in no way to be interpreted as limiting of the invention. The examples demonstrate the preparation of MgO/Ag sheathed tapes of (Bi,Pb)$_2$Sr$_2$Ca$_2$Cu$_3$O$_y$. The first objective was to obtain MgO/Ag sheathed tapes with sufficient mechanical strength and ductility for processing into (Bi, Pb)$_2$Sr$_2$Ca$_2$Cu$_3$O$_y$ tapes. The second objective was to obtain MgO/Ag sheathed tapes with superconducting properties as good as tapes prepared from silver alone. The third objective was to obtain MgO/Ag tapes with improved BSCCO-2212 texture which leads to improved BSCCO-2223 texture.

Composite tapes were prepared using a metallic precursor to $(Bi,Pb)_2Sr_2Ca_2Cu_3O_y$ sheathed in either a substantially pure silver sheath (comparison example 1) and in a 0.21 wt % Mg-Ag alloy sheath (example 2). The silver sheathed and Mg-silver alloy sheathed tapes were subjected to various heating cycles, and the mechanical and electrical properties of the samples were determined and compared.

A mechanically alloyed precursor powder was prepared having the compositions set forth in Table 1. Small differences in metallic precursor composition are due to non-uniformity of metallic precursor batch preparation. As has been observed previously, an excess of copper up to 30 wt % over stoichiometry is included in the precursor alloy. See, co-pending U.S. Ser. No. 08/102,561, filed Aug. 5, 1993, herein incorporated by reference. The powders were introduced into a silver can of the appropriate composition, and the powder filled can was extruded through a hexagonal die to form a monofilament. A plurality of such monofilaments were bundled together and extruded to form a multifilamentary wire, which was then extruded into a tape having the dimensions of 0.030×0.150" (7.6×38 mm). The fill factor (vol % metallic precursor powder) was approximately 20%.

TABLE 1

Tape compositions.

| Exp. No | sheath composition | metallic precursor composition (ratio) | | | | | |
|---|---|---|---|---|---|---|---|
| | | Pb | Bi | Sr | Ca | Cu | Ag |
| Comparison Example 1 | 99.9% Ag | 0.34 | 1.74 | 1.94 | 1.97 | 3.67 | 38.1 |
| Example 2 | 0.21% Mg—Ag | 0.34 | 1.74 | 1.94 | 1.96 | 4.00 | 39.18 |

The tapes comprised of the Mg-silver alloy sheath (Example 2) were oxidized at 420° C. at 100 atm $O_2$ for 450 hours to oxidize Mg to MgO and the metallic precursor to a precursor oxide. The oxygen activity of the samples were equilibrated to ambient oxygen conditions by heating at 400° C. in 7.5% $O_2$ for 40 hours. The pure silver sheathed examples (Comparison Example 1) were oxidized under the same conditions.

The Mg-silver alloy sheathed samples (Example 2) were given a softening anneal to both relieve internal stresses and to convert a portion of the sample into BSCCO-2212 (the anisotropic oxide of the BSCCO system). Two softening anneal conditions were investigated to compare the effectiveness of softening anneals: (1) 782° C. in 0.075 atm oxygen for 3 hour; and (2) 813° C. in 0.21 atm $O_2$ for 6 minutes. Both temperatures were effective to form BSCCO-2212. Pure silver sheathed samples (Comparison Example 1) were heat treated at 782° C. in 0.075 atm $O_2$ for 3 hours as this condition was known to convert the precursor oxide into BSCCO-2212.

The samples were then deformation processed using a rolling deformation. For the samples heated at 782° C., the rolling reduction cycle used a 9% reduction per rolling pass with 6–8 passes in each deformation processing step. A 450° C. heat treatment was used every fourth pass. For the samples heated at 813° C., the rolling sequence was similar to that for the 782° C., except that it was repeated two and four times for examples 2-3 and 2-4, respectively.

The softening anneal/rolling deformation steps were carried out one-, two- and four-times. The anneal and deformation cycles are set forth in Table 2. The samples were evaluated for cracking and mechanical failure after each anneal/deformation iteration.

Comparison example 1 was annealed at 782° C. and crack free tapes were obtained in tapes rolled down to 0.0055". This is the standard against which the ODS hardened examples were compared.

Example 2-1 was annealed at 782° C., followed by rolling strains of about 50% to 60%, to produce MgO-Ag sheathed tapes that exhibited transverse cracking (cracking across the width of the tape) and longitudinal cracking (cracking along the length of the tape). This cracking was the result of low ductility, in which the rolling stress was accommodated by macroscopic cracking. Anneals at 450° C. after every fourth 9% reduction pass did not alleviate the cracking. Upon rolling reduction to 0.015", longitudinal cracking was so severe, the tape split apart. Thus, an anneal at 782° C. was not effective to relieve the internal stress of the composite and produced a sample of only limited ductility.

Example 2-2 was annealed at 813° C. and the observations described hereinbelow demonstrate that this anneal is sufficient to relieve internal stresses of the composite. By heat treating at 813° C., accumulated rolling strains of about 30 to 53% were sufficiently relieved such that additional deformation could follow. Visual inspection of the tape before deformation rolling showed no signs of transverse or longitudinal cracking. The workability of the composite was demonstrably better than for example 2-1, and rolling deformations down to a thickness of about 0.012" was possible before onset of transverse and longitudinal cracking. The relative success and failure of examples 2-1 and 2-2 demonstrate the effect of the softening anneal temperature on alleviating the internal stress of the composite.

Examples 2-3 and 2-4 were also annealed at 813° C. and demonstrated the advantages of multiple softening annealing and deformation cycles. Example 2-3 was first rolled to a thickness of 0.0142" and then reannealed at 813° C. Example 2-4 was first rolled to a thickness of 0.0207", reannealed at 813° C., rolled to a thickness of 0.0142", reannealed at 813° C. and rolled to a thickness of 0.0097" and then reannealed at 813° C. for a last time. Both samples produced crack free tapes at each of the final thicknesses of 0.0081", 0.0067" or 0.0055". Thus, use of two or more softening anneal/deformation cycles provides precipitate hardened silver sheathed oxide superconductor composites having ductility comparable to silver-only sheathed composites.

TABLE 2

Anneal and deformation cycles.

| example no. | no. of anneal/ deformation cycles | annual heat treatment T(°C.); t(min); $P_{O2}$(atm) | heat treatment thickness (in) | final thickness (in) | observations |
|---|---|---|---|---|---|
| 2-1 | 1 | 782/180/ 0.075 | 0.030 | N/A | transverse and longitudinal cracking at onset; failure at 0.015" |
| 2-2 | 1 | 813/6/0.21 | 0.030 | N/A | some transverse and longitudinal cracking at 0.012" |
| 2-3 | 2 | 813/6/0.21 | 0.030, 0.0142 | 0.0081, 0.0067, 0.0055 | crack free to 0.0055" |

TABLE 2-continued

Anneal and deformation cycles.

| example no. | no. of anneal/ deforma- tion cycles | annual heat treatment T(°C.); t(min); P$_{O2}$(atm) | heat treatment thickness (in) | final thickness (in) | observations |
|---|---|---|---|---|---|
| 2-4 | 4 | 813/6/0.21 | 0.030, 0.0207, 0.0142, 0.0097 | 0.0081, 0.0067, 0.0055 | crack free to 0.0055" |

The extent of anisotropic oxide texturing was determined on samples which had been rolled to a thickness of 0.0067". Degree of texturing is determined by analysis of the relative intensity of the 008 peak of BSCCO 2212 to the sum of the 008 and 105 peak of BSCCO 2212 the X-ray diffraction scan. Degree of texturing is reported as an "texture factor", a value between zero and one, where "zero" indicates no texture and "one" indicates complete texture. Texture factors for comparison examples and examples 2-3 and 2-4 are shown in Table 3 and demonstrate that Mg/Ag sheathed composites exhibited a significantly greater degree of texture.

TABLE 3

Texture factors for selected examples.

| Example no. | No. of anneal/ deformation cycle | texture factor |
|---|---|---|
| 1-3 | 2 | 0.58 |
| 1-4 | 4 | 0.61 |
| 2-3 | 2 | 0.67 |
| 2-4 | 4 | 0.67 |

Examples 2-3 and 2-4 were further heat treated at 829° C. for 20 hours to form BSCCO-2223, followed by a 2223 texturing strain of 17%. BSCCO-2223 phase optimization was obtained by heat treatment according to WO 94/23459, herein incorporated by reference. In particular, the samples were heated at 829° C. for 60 hours, cooling to and maintaining at 811° C. for 120 hour, further cooling to 787° C. and holding for 30 hours, all at 0.075 atm oxygen. The samples were additionally heat treated at 745° C. for 45 hours in 0.003 atm oxygen and then cooled to room temperature. Critical current density were determined for these examples and are shown in the FIGURE, which is a plot of critical current density for comparison Example 1-3 (curve 12), Example 1-4 (curve 14), Example 2-3 (curve 16) and Example 2-4 (curve 18). Critical current density is superior in all cases in the MgO-Ag sheathed samples and the improvement becomes even more noticeable at thinner tape dimensions.

By comparing the electrical results of comparison example 1 and example 2, it can be clearly seen that Mg and MgO do not have an adverse effect on the $J_c$ of the resulting oxide superconducting tape and in fact that the ODS hardened sheath contributes to the general improvement of the $J_c$ in these tapes.

Other embodiments of the invention will be apparent to the skilled in the art from a consideration of the specification or practice of the invention disclosed herein. It is intended that the specification and examples be considered as exemplary only, with the true scope and spirit of the invention being indicated by the following claims.

What is claimed is:

1. An oxide superconductor precursor metallic alloy composite, comprising:

a precursor metallic alloy phase comprising component metallic elements of an oxide superconductor in substantially stoichiometric proportions; and a noble metal phase alloyed with a solute metal in intimate contact with the precursor metallic alloy, the solute metal present in an amount effective upon oxidation to form metal oxide domains that increase hardness of the composite.

2. The composite of claim 1, wherein the noble metal is selected from the group consisting of silver, gold, palladium and mixtures thereof.

3. The oxide composite of claim 1, wherein the precursor alloy comprises an excess of copper up to a 30 wt % excess.

4. The composite of claim 1, wherein the solute metal comprises an amount sufficient to provide about 0.01 vol % to about 2.0 vol % metal oxide upon oxidation.

5. The composite of claim 1, wherein the solute metal is selected from the group consisting of Mg, Zr, Hf, Ti, Al, alkaline earths, lanthanides and mixtures thereof.

* * * * *